United States Patent [19]

Srivastava

[11] Patent Number: 4,901,429

[45] Date of Patent: Feb. 20, 1990

[54] METHOD AND APPARATUS FOR MAKING A SUPERCONDUCTING JOINT

[75] Inventor: Vishnu C. Srivastava, Florence, S.C.

[73] Assignee: General Electric Company, Milwaukee, Wis.

[21] Appl. No.: 157,345

[22] Filed: Feb. 17, 1988

[51] Int. Cl.[4] ............................................. H01L 9/29
[52] U.S. Cl. ....................................... 29/599; 29/868
[58] Field of Search ................. 29/599, 860, 868, 869

[56] References Cited

U.S. PATENT DOCUMENTS

| | | |
|---|---|---|
| 3,317,286 | 5/1967 | DeSorbo ............................ 29/599 X |
| 4,179,802 | 12/1979 | Joshi et al. . |
| 4,584,547 | 12/1986 | Thornton . |
| 4,631,808 | 12/1986 | Jones . |
| 4,713,878 | 12/1987 | Kumpitsch et al. . |

FOREIGN PATENT DOCUMENTS

| | | |
|---|---|---|
| 130442 | 1/1985 | European Pat. Off. . |
| 0184184 | 11/1986 | European Pat. Off. . |
| 80/02084 | 10/1980 | World Int. Prop. O. ............ 29/599 |

OTHER PUBLICATIONS

Review of Scientific Instruments, vol. 50, No. 12, Dec. 1979, pp. 1651–1652.
IEEE Transactions on Magnetics, vol. MAG-13, No. 1, Jan. 1977, pp. 94–96.

Primary Examiner—Howard N. Goldberg
Assistant Examiner—Carl J. Arbes
Attorney, Agent, or Firm—Quarles & Brady

[57] ABSTRACT

A method of forming a superconductive joint between superconductors made of filaments of superconducting material embedded in a matrix material utilizes two baths of molten metals. One of the baths of molten metal is used for etching the matrix material away from the superconducting filaments and is vibrated at an ultrasonic frequency. The other bath is also vibrated at an ultrasonic frequency and is used to mold the etched superconductors into a superconducting joint. Superconducting joints may thereby be made under ordinary atmospheric conditions between superconducting wires having similar and/or different matrix materials.

8 Claims, 1 Drawing Sheet

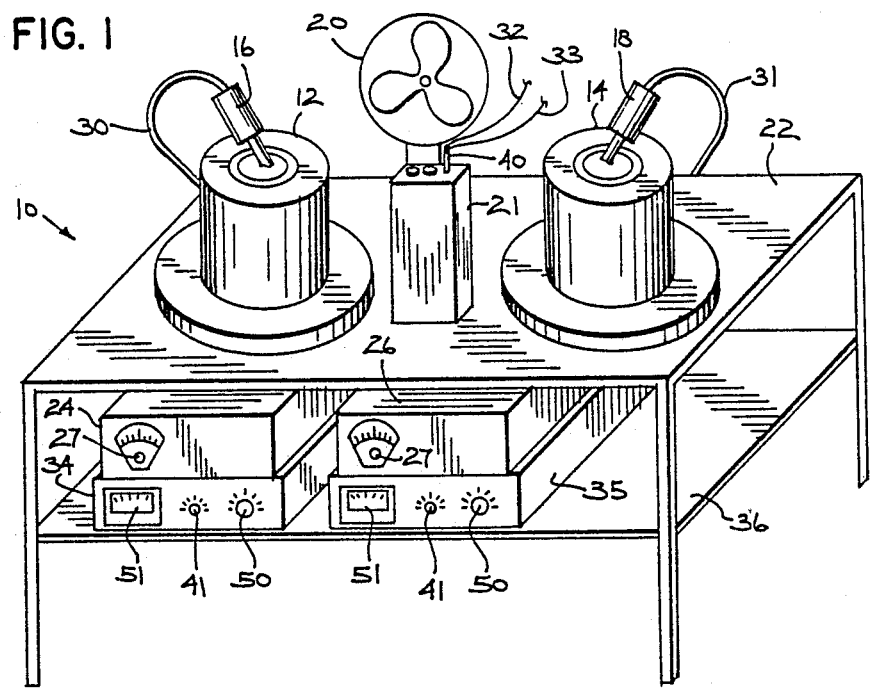
FIG. 1
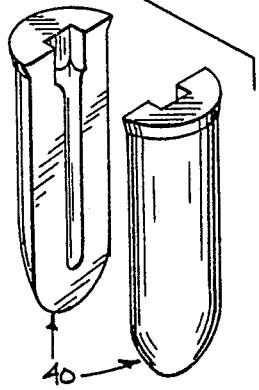
FIG. 2
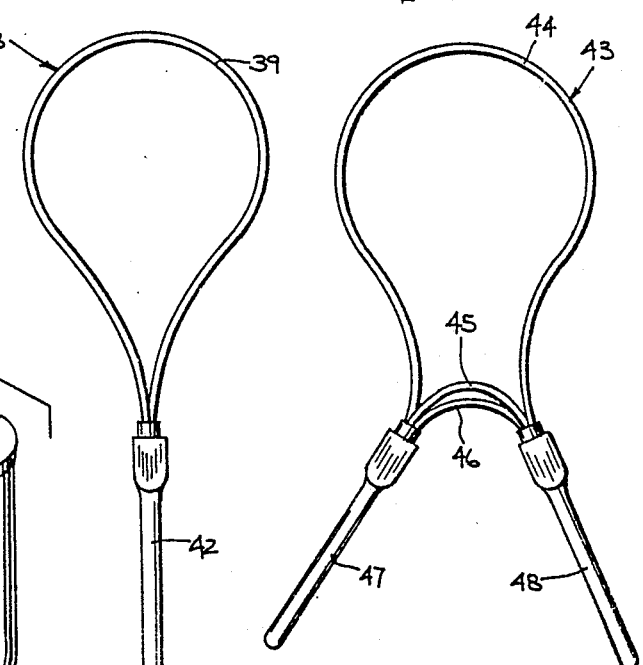
FIG. 3
FIG. 4

METHOD AND APPARATUS FOR MAKING A SUPERCONDUCTING JOINT

BACKGROUND OF THE INVENTION

1. Field Of The Invention

This invention relates to a method and apparatus for making a superconducting joint and particularly to such a method and apparatus for making a superconducting joint between multifilamentary superconducting wires with similar and/or different matrix materials.

2. Discussion Of The Prior Art

It is well known that the resistance to current flow of many materials falls to zero, thereby making them superconducting, when they are cooled to a low temperature, known as the critical temperature. Superconducting wires typically comprise a superconducting material embedded in a matrix material, which may be, for example, copper or cupro-nickel, which is not itself a superconducting material. In the case of wire made of niobium-titanium alloy, which is a common superconducting material, the alloy may be in the form of filaments and the filaments encased by the matrix material.

It is necessary to form joints which are themselves superconducting to be able to usefully incorporate such superconducting wires into a superconducting circuit. For example, the wire may be wound into a coil to produce a high magnetic field, such as in an MR scanner. The coil cannot be made in a loop because it is necessary to be able to turn such a coil on and off. For that purpose, a superconducting switch is connected between the ends of the coil. To make the connection, it is necessary to make superconducting joints between the switch leads and the coil leads which result in a continuous circuit which is superconducting at the critical temperature and in a high magnetic field.

Methods are known for joining superconductors. One such method in disclosed in Thornton U.S. Pat. No. 4,584,547, which is owned by the assignee of the present invention. Thornton describes a method of making a superconducting joint which uses one or two pots of molten metal to etch the matrix material away from the filaments and then solder the filaments of the superconductors to be joined together. It is also known to use such a process to mold the filaments of the superconductors to be joined together with the molten metal while rotating each solder pot. This method is fully disclosed in Kumpitsch et al. U.S. Pat. No. 4,713,878, which is also owned by the assignee of the present invention. Typically in these processes, the etching metal used was tin and the soldering/molding material was lead-bismuth.

However, such processes were best performed in a controlled environment, such as a glove box, to insure producing good quality joints. Otherwise, oxides and other contaminants were believed to interfere with the joint and make it non-superconductive.

In addition, it has been difficult to join superconductors of one matrix material to superconductors of another matrix material, even if the superconductor material was the same. For example, copper matrix niobium-titanium multifilamentary wire was difficult to join to cupro-nickel matrix multifilamentary wire.

SUMMARY OF THE INVENTION

The invention provides a method of making a joint between superconductors made of filaments of superconducting material embedded in a matrix material which overcomes the above disadvantages. As a part of the method, a bath of molten metal is provided and is vibrated at an ultrasonic frequency. This vibrating bath is then used to etch and/or mold the ends of one or more superconductors into a superconducting joint. In this way, a highly reliable superconducting joint capable of conducting high currents is produced. The method may be performed under ordinary atmospheric conditions and may also be used to make joints between superconductors having different matrix materials.

In a preferred form, a bath of one molten metal is used to etch the superconductors to be joined and a bath of another molten metal, which is a superconducting material, is used to mold the joint. Both baths are vibrated at an ultrasonic frequency, the first bath being vibrated to remove the matrix material from the ends of the superconductors and the second bath being vibrated to remove the metal of the first bath and further wet the ends. A mold is then filled with molten metal from the second bath and the ends of the superconductor are placed in the mold and solidified therein to form the joint.

In the preferred form, ultrasonic horns are used to vibrate the molten metal baths. A horn is placed near the center of each bath with its tip submerged therein. The ends of the superconductors to be etched and/or molded are then placed in the baths close to the horn.

It is therefore a principal object of the invention to provide a reliable method of making superconducting joints.

It is another object of the invention to provide such a method which may be easily performed under atmospheric conditions.

It is another object of the invention to provide such a method which may be used to join superconductors which are made of different matrix materials.

It is another object of the invention to provide such a method for making superconducting joints which are capable of carrying a high persistent current in a magnetic field.

These and other objects of the invention will be apparent from the drawings and from the detailed description.

DESCRIPTION OF THE DRAWINGS

The present invention is described below, as required by 35 U.S.C. §112, in such full detail as to enable those skilled in the art to practice the invention and also to set forth the presently-contemplated best mode for its practice, all by reference to the following drawings in which:

FIG. 1 is a perspective view of an apparatus for performing the method of making a superconducting joint of the present invention;

FIG. 2 is a perspective view of a mold for making a superconducting joint of the present invention;

FIG. 3 is an elevation view of a superconducting loop made with a joint of the present invention; and FIG. 4 is an elevation view of another superconducting loop made with two joints of the present invention.

DETAILED DESCRIPTION OF THE PREFERRED EMBODIMENT

Referring to FIG. 1, an apparatus 10 for performing a method of making a superconducting joint according to the invention is disclosed. The apparatus shown includes two heated pots 12 and 14 for melting metals placed therein and holding them at a set temperature, ultrasonic horns 16 and 18 in the pots 12 and 14, respectively, and a fan 20 and phenolic holding fixture 21 for cooling completed joints, all supported on a table 22.

The pots 12 and 14 are standard solder pots and are controlled respectively by power supplies 24 and 26. Each power supply 24 and 26 has a dial 27 with which the temperature of the corresponding pot can be set. The range of temperatures in the preferred embodiment which can be set is 0°–600° C. and the set temperature is accurate to within 2° C. Generally, the normal range in which the temperature will be set for making joints of the invention is 100°–500° C. In the preferred embodiment, the inside dimensions of each of the pots 12 and 14 is five inches deep and five inches in diameter.

Each horn 16 and 18 has a cord 30 and 31 which is connected to a controller 34 and 35, respectively, supported on a shelf 36 of the table 22. Each horn 16 and 18 may be of the piezoelectric crystal transducer type and operate at a frequency of approximately 20 kilohertz. In the preferred embodiment, each horn 16 and 18 has a maximum acoustical output power of approximately 150 watts. The generators 34 and 35 are matched to the horns 16 and 18 and are usually initially purchased as a unit. Horns found suitable in the preferred embodiment are the Model BP-4 and generators found suitable are the Model SG-250, both of which are commercially available from Blackstone Corporation, Ultrasonic Division, Jamestown, NY 14701. The horns 16 and 18 are $2\frac{1}{2}''$ in diameter by 11" long with a $1\frac{1}{2}''$ diameter aluminum output coupling piece.

The pot 12 is filled with molten tin (Sn) and the pot 14 is filled with molten lead-bismuth (Pb-Bi). The tin is 99.99% pure and the lead-bismuth is a 40% lead, 60% bismuth (by weight) alloy with the lead and bismuth going into the alloy each being 99.999% pure and the maximum impurities in the alloy being 95 parts per million. The temperature of the molten tin and of the molten lead-bismuth varies according to the particular types of wire being joined, but usually is in the range of 300°–450° C.

The horns 16 and 18 must be properly coupled to the molten metals in the pots 12 and 14. Each horn should be oriented at an angle of about 45° and positioned with its end entering approximately the center of the corresponding pot. The tip of the each horn should be submerged in the molten metal at least 1 inch.

The horns are turned on and allowed to stabilize within the pots. It may also be necessary to provide a cooling air flow, such as from a compressed air source, to cool the ultrasonic probes, according to the manufacturer's specifications. The horns also must be tuned after they are on, and this usually requires setting a power level control 50 and then adjusting a tuner control 41 to a null, where a power meter 51 indicates the lowest reading at the power setting, of each of the controllers 34 and 35. After being tuned, the power meter 51 is reset to zero, and the system is allowed to stabilize for 10–15 minutes. Then, the power meter 51 is adjusted to a reading of 50–75 watts and the apparatus is ready to begin making joints. However, as the horns are operating in the pots 12 and 14, they erode so that during the course of production, the power readings will change and tuning will be necessary periodically. When the horns can no longer be tuned to their lowest power reading, they must be replaced.

The general procedure for molding joints according to the invention begins with assuring that both pots have stabilized at the appropriate temperature for the particular type of joint to be made. A running log of the number and type of joints made is also kept for each of the pots to assure that the pot has not reached an unacceptable level of impurities. The number of joints allowed before changing the metals in the pots will depend upon the size of the wires and the size of the pots. Further discussion may be found in the examples which follow.

If the wires are insulated, the insulation, which may be made of, for example, formvar varnish, is then stripped from the ends of the wires to be joined. Approximately 2" from the ends, the wires to be joined are fastened together using a piece of thin copper wire and a shallow mark is scribed into the wires approximately 1.5" from the ends. Oxides and other impurities which have formed are then skimmed from the top of the tin pot 12 and the wires are inserted into the pot up to the 1.5" scribe mark. The wires are inserted near the horn blade but not touching it. The wires are held in the pot 12 for a certain time, which also varies according to the type of joint being made. The wires may be held manually, but preferably are held with a suitable clamping fixture (not shown).

Placing the wires in the tin in the pot 12 etches the matrix material away from the filaments of the superconducting wires. This must be done to electrically couple the wires to be joined. The matrix material disperses into the tin bath under the action of the ultrasonic horns and it is believed that such action contributes to high purity tin being in the immediate vicinity of the wires in the center of the pot near the horn. It is also believed that the ultrasonic energy imparted to the tin bath helps to more completely remove the matrix material from the filaments, thereby helping to reduce the amount of impurities in the final joint.

After the time for etching in the tin has expired, the impurities are skimmed from the top of the tin and from the top of the lead-bismuth (such as with stainless steel spoons, not shown) and the wire ends are transferred from the tin to the lead-bismuth in the pot 14. In the lead-bismuth, the wires are also positioned adjacent to but not touching the horn 18 and up to the 1.5" scribe mark. Under the action of the ultrasonic horn 18 in the lead-bismuth pot 14, the tin is removed from the filaments as well as any remaining matrix material or other impurities.

The temperature and dipping time in the lead-bismuth depends upon the particular type of joint being formed and the wires used. The wires are in the lead-bismuth for a certain set time, during which a two-part mold (FIG. 2), which is fastened together such as with appropriate clips (not shown), is placed in the lead-bismuth. The mold 40 is allowed to fill with the lead-bismuth and when the set time in the lead-bismuth for the joint has expired, the mold is emptied, the wires are placed in the mold, and the mold is then refilled with lead-bismuth. During this operation, impurities forming on top of the lead-bismuth should be removed.

After the mold 40 is filled, it is tapped to remove any air bubbles and checked to assure that the filaments of the wires are completely inside the mold. If the mold 40 leaks, it is refilled with lead-bismuth. The mold, with wires 32 and 33 therein, is then placed in the fixture 21 in front of the fan 20 to cool as shown in FIG. 1. Appropriate fixtures (not shown) may be used to hold the mold 40 and the wires 32 and 33 in the pot 14 and to hold the wires in the molten lead-bismuth when the mold is in the fixture 21. When the lead-bismuth has solidified, the mold is removed, along with any excess flashing, to produce a finished joint.

EXAMPLE 1

Joints were made according to the invention using a single section of copper-matrix wire, hereby designated wire W, and joining its ends together. The superconducting wire W is a copper matrix niobium-titanium multifilamentary superconducting composite conductor. Preferably, the superconducting material of the filaments is 46.5 plus or minus 1.5 weight percent titanium. The matrix material is CDA-10100 (oxygen free electronic) copper. The volume ratio of copper to niobium-titanium is a minimum of 2.3:1 in the final conductor. Some of the wire used to make joints according to this example was also insulated with a formvar varnish coating.

The dimensions of each wire W prior to insulation is preferably 0.050 by 0.100 inches nominally. If insulated, the insulated wire dimensions are nominally 0.053 by 0.103 inches and has a minimum 0.025 inch flat on the 0.053 inch side and a minimum 0.075 inch flat on the 0.103 inch side. The equivalent average filament size in the final conductor is preferably between 30 and 60 microns in diameter. The twist pitch length of the wire should be 3.0 plus or minus 0.5 inches. As such, the minimum critical current of this wire should be 3200 amps in a magnetic field of 2 Tesla at 4.2° K. and 2000 amps in a magnetic field of 4 Tesla at 4.2° K.

To make a joint with the wire W, the metals in both pots 12 and 14 were held at 400° C. The etching time in the tin was 15-18 minutes and the soaking time in the lead-bismuth was 8-10 minutes. Eight of these joints were made using the single loop construction 38 shown in FIG. 3, which includes a wire 39 and a joint 42. These eight joints were tested and found capable of conducting persistent currents (i.e., equivalent decays of less than 0.1 ppm/hr.) ranging from 2820-3180 amperes.

Starting with new tin and new lead-bismuth, approximately 60 of the joints 42 of this example could reliably be made using the apparatus of the preferred embodiment before replacing the metals. Also, in production, it was found desirable (for a margin of safety) to reduce the temperature of the metal baths to 350° C., increase the etching time in the tin to 30 minutes, and adjust the soaking time in the lead-bismuth to 7-10 minutes, with comparable current carrying results being obtained.

EXAMPLE 2

Other joints were made according to the invention in which a single length of the wire W, described above, was joined in parallel to two lengths of a wire hereby designated as X. The superconducting wire X is a cupro-nickel matrix niobium-titanium multifilamentary (576 filaments) superconducting composite conductor. Preferably, the superconducting material of the filaments is 46.5 plus or minus 1.5 weight percent titanium. The matrix material is 70% copper, 30% nickel with a nominal resistivity of $3.2 \times 10^{-5}$ ohm-cm at room temperature. The outer jacket of the wire is 90% copper, 10% nickel with a nominal resistivity of $1.5 \times 10^{-5}$ ohm-cm at room temperature. The volume ratio of cupro-nickel to niobium-titanium is nominally 1.10:1 in the final conductor. Each wire is also fully cured formvar varnish coated for insulation.

The diameter of each wire X prior to insulation is preferably 0.041 inches nominally. The insulated wire diameter is nominally 0.044 inches. The equivalent average filament size in the final conductor is preferably 29 microns in diameter nominally and should not be greater than about 32 microns. The twist pitch length of the wire should be 1.0 plus or minus 0.25 inches. As such, the minimum critical current of this wire should be 630 amps in a magnetic field of 5 Tesla at 4.2° K.

A finished test loop 43 including wires 44, 45 and 46, and joints 47 and 48, as made in this example is shown in FIG. 4. Five of the test loops 43 were made in each of two batches. In the first batch, both metals in the pots 12 and 14 were held at 400° C., the etching time in the tin was 25-30 minutes, and the soaking time in the lead-bismuth was 8-10 minutes. In the second batch, both metals in the pots 12 and 14 were held at 450° C., the etching time in the tin was 15-18 minutes, and the soaking time in the lead-bismuth was 8-10 minutes. Loops from the first batch exhibited persistent current carrying capacities ranging from 1978-2087 amperes and loops from the second batch attained persistent currents in the range of 1456-1864 amperes. The quench currents for the first batch were also measured and found to be 3362-4247 amperes.

In production, the temperature and time parameters found most desirable were: temperature of both baths: 400° C., etching time in tin: 25 minutes, soaking time in lead-bismuth: 7-10 minutes. Starting with new tin and new lead-bismuth, 180 or more of these joints could reliably be made using the apparatus of the preferred embodiment before finding it desirable to change the metals in the pots 12 and 14.

EXAMPLE 3

Other loop configurations like that shown in FIG. 3 having only one joint of the invention were made with three strands of the wire X (instead of only one strand as shown in FIG. 3). In making these test loops, both baths were held at 400° C., the etching time in the tin was 40-60 minutes, and the soaking time in the lead-bismuth was 7-10 minutes. Five of these loops were made and were found to conduct persistent currents ranging from 1500-2227 amperes and quench currents ranging from 3500-4626 amperes.

EXAMPLE 4

Other parallel circuit configurations like that shown in FIG. 4, but with three wires between the joints 47 and 48 instead of the two wires 45 and 46, were made having joints according to the invention. In these test loops, the three lengths were of wire X and the one length was of wire W. Both bath temperatures were approximately 400° C., the etching time in the tin was 40-60 minutes, and the soaking time in the lead-bismuth was 7-10 minutes. Persistent current measurements for five of these joints fell in the range 1597-2551 amperes and quench currents were measured to be in the range 3383-5201 amperes.

EXAMPLE 5

Other parallel circuit configurations like that shown in FIG. 4 (but with only one wire between the joints 47 and 48 instead of the two wires 45 and 46) were made having joints according to the invention. In these test loops, one length of wire hereby designated Y and one length of the wire X were joined with two joints of the invention.

The superconducting wire Y is a copper matrix niobium-titanium multifilamentary superconducting composite conductor. Preferably, the superconducting material of the filaments is 46.5 plus or minus 1.5 weight percent titanium. The matrix material is CDA-10100 (oxygen free electronic) copper. The volume ratio of copper to niobium-titanium is 2.0 (±0.15):1 in the final conductor. Each wire is also fully cured formvar varnish coated for insulation.

The diameter of the wire Y prior to insulation is preferably 0.0273 inches nominally. The insulated wire diameter is nominally 0.0293 inches. The equivalent average filament size in the final conductor is nominally 40 microns in diameter. The twist pitch length of the wire should be 1.25 plus or minus 0.25 inches. As such, the minimum critical current of this wire should be 500 amps in a magnetic field of 1 Tesla at 4.2° K. and 275 amps in a magnetic field of 3 Tesla at 4.2° K.

For these joints, the pots 12 and 14 were optimally held at 400° C., the wires were etched in the tin for 15-18 minutes, and soaked in the lead-bismuth for 7-10 minutes. Twenty of these joints were made and exhibited a persistent current capacity falling in the range of 474-695 amperes and quench currents in the range of 732-862 amperes.

Five more joints were made as in this example but with the temperature of both baths 450° C., the etching time in the tin 12-15 minutes, and the soaking time in the lead-bismuth 7-10 minutes. These joints exhibited persistent current capacities in the range of 448-568 amperes.

All of the above joints were made under atmospheric conditions without any protective shielding or gases. Moreover, the joints made as described in examples 2, 4 and 5, above, were between superconductors having different matrix materials (wires W and Y have copper matrices and wire X has a cupro-nickel matrix). In addition, as illustrated by examples 1 and 3, above, the method is also effective to join superconductors of the same matrix material, and does so whether the matrix material is copper or an alloy, such as cupro-nickel.

Many modifications and variations of the preferred embodiment will be apparent to those of ordinary skill in the art but will still be within the spirit and scope of the invention. For example, metals other than tin and lead-bismuth could be used as long as the metal in the pot 12 is a solvent of the superconducting wire matrix material and the metal in the pot 14 is a superconductive solder. Also, it may be possible in some applications to use a single molten bath to do the etching and the molding. Therefore, the invention should not be limited by the scope of the preferred embodiment, but only by the claims which follow.

I claim:

1. A method of making a joint between superconductors made of filaments of superconducting material embedded in a matrix material including the steps of:
    stripping the matrix material away from ends of the superconductors to be joined;
    providing a heated soldering bath of molten metal, said metal being a superconducting material;
    vibrating the soldering bath at an ultrasonic frequency;
    submerging the stripped ends to be joined of the superconductors into the vibrating soldering bath;
    filling a mold with the superconductive material of the soldering bath in a molten state;
    placing the ends of the superconductors to be joined into the molten superconductive material in the mold; and
    cooling the superconductive material in the mold to encase the ends of the superconductors in the solidified superconducting material of the soldering bath.

2. A method as in claim 1, wherein the matrix materials of the superconductors to be joined differ.

3. A method as in claim 1, wherein the method is performed under atmospheric conditions.

4. A method as in claim 1, wherein the bath is vibrated by an ultrasonic horn at least partially submerged in the bath.

5. A method as in claim 4, wherein the horn is positioned approximately in the center of the bath.

6. A method as in claim 4, wherein the end of the superconductor is dipped in the bath adjacent to the horn.

7. A method as in claim 1, wherein the step of stripping the matrix material away from ends of the superconductors to be joined comprises:
    providing an etching bath of molten metal for stripping the matrix material away from the ends of the superconductors to be joined;
    vibrating the etching bath at an ultrasonic frequency; and
    holding the ends of the superconductors to be joined in the etching bath until the matrix material is stripped from the filaments.

8. A method as in claim 7, wherein the soldering and etching baths are two different baths and are of different metals.

* * * * *